United States Patent

Lin et al.

[11] Patent Number: 5,945,696
[45] Date of Patent: Aug. 31, 1999

[54] SILICON CHIP HAVING MIXED INPUT/OUTPUT SLOT STRUCTURE

[75] Inventors: Hsiao-Ping Lin, Taipei; Tin-Hao Lin, Hsinchu, both of Taiwan

[73] Assignee: Faraday Technology Corp., Hsinchu, Taiwan

[21] Appl. No.: 09/065,471

[22] Filed: Apr. 23, 1998

[30] Foreign Application Priority Data

Feb. 16, 1998 [TW] Taiwan .................................. 87102082

[51] Int. Cl.⁶ ........................................................ H01L 27/10
[52] U.S. Cl. .......................................... 257/203; 257/207
[58] Field of Search .................................... 257/202–211

[56] References Cited

U.S. PATENT DOCUMENTS

| | | | |
|---|---|---|---|
| 5,347,150 | 9/1994 | Sakai et al. | 257/203 |
| 5,401,989 | 3/1995 | Kikuchi | 257/207 |
| 5,539,223 | 7/1996 | Sugoh et al. | 257/203 |
| 5,641,978 | 6/1997 | Jassowski | 257/203 |
| 5,646,422 | 7/1997 | Hashizume | 257/203 |
| 5,777,354 | 7/1998 | Cheung et al. | 257/203 |

FOREIGN PATENT DOCUMENTS

| | | | |
|---|---|---|---|
| 1-066950 | 3/1989 | Japan | 257/203 |
| 2-275653 | 11/1990 | Japan | 257/203 |
| 3-138972 | 6/1991 | Japan | 257/203 |
| 4-015954 | 1/1992 | Japan | 257/203 |

*Primary Examiner*—David B. Hardy
*Attorney, Agent, or Firm*—Thomas, Kayden, Horstemeyer & Risley, L.L.P.

[57] ABSTRACT

A silicon chip having a mixed input/output slot structure comprising a core region having a plurality of circuits formed thereon, a wiring region surrounding and linked to the core region, and an input/output area surrounding and linked to the wiring region, where the input/output area has a plurality of input/output slots and four corner cells. The input/output slots can be divided into groups with each group having a different height, and input/output slots on the same side of the input/output area all have the same height. Therefore, a choice of sides for placing the input/output slots can be made, and the layout of input/output slots around the silicon chip is not be restricted by one side. Hence, chip size can be reduced and chip surface can be fully utilized.

14 Claims, 3 Drawing Sheets

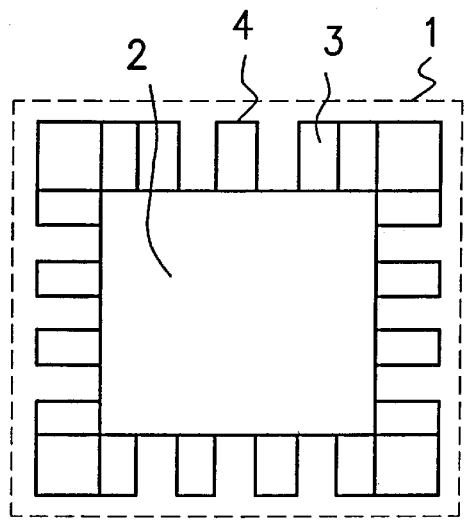
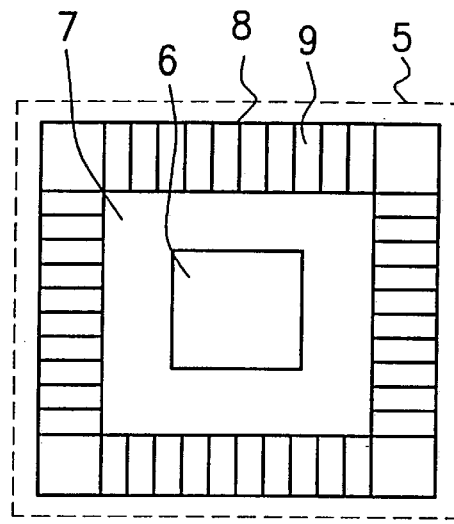
FIG. 1  FIG. 2
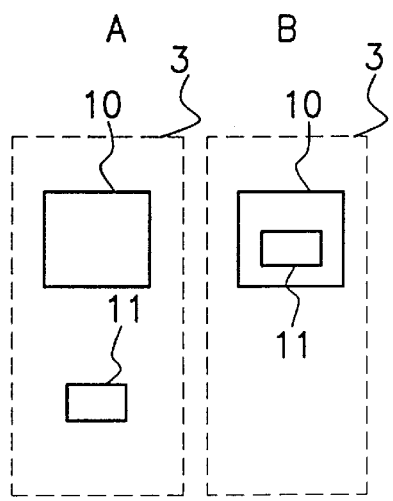
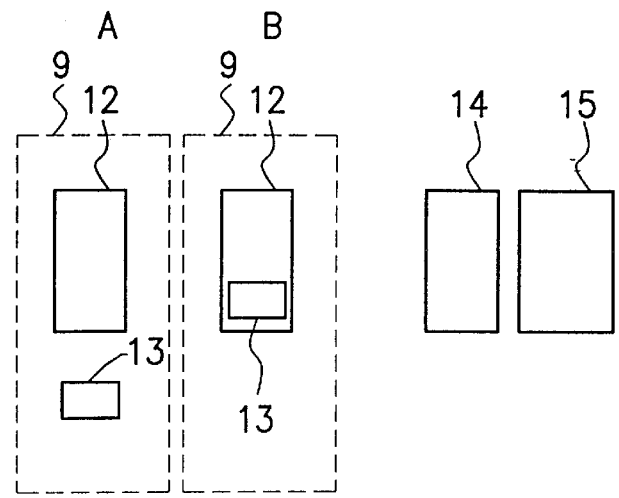
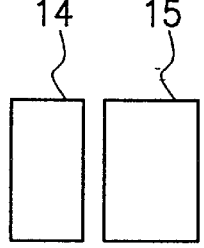
FIG. 3  FIG. 4  FIG. 5

SILICON CHIP HAVING MIXED INPUT/OUTPUT SLOT STRUCTURE

CROSS-REFERENCE TO RELATED APPLICATION

This application claims the priority benefit of Taiwan application serial no. 87102082, filed Feb. 16, 1998, the full disclosure of which is incorporated herein by reference.

BACKGROUND OF THE INVENTION

1. Field of Invention

The present invention relates to input/output structure of a silicon chip. More particularly, the present invention relates to a silicon chip design having a mixed input/output slot structure.

2. Description of Related Art

FIG. 1 is a sketch of a silicon chip having a core limited design. As shown in FIG. 1, the silicon chip 1 has a core region 2 and a number of input/output slots (I/O slots) 3 inside the input/output area (I/O area) 4. The I/O area 4 is located on a peripheral strip surrounding the core region 2.

FIG. 2 is a sketch of a silicon chip having a pad limited design. As shown in FIG. 2, the pad limited design has a structure similar to that of the core limited design. The silicon chip 5 also has a core region 6 and a number of input/output slots (I/O slots) 9 inside the input/output area (I/O area) 8. However, there is an additional wiring area 7 between the core region 6 and the input/output area 8.

In general, the core region 2 of silicon chip 1 as shown in FIG. 1 has a high gate count. In other words, the internal circuitry of core region 2 is more complex than that of core region 6. Hence, core region 2 is much bigger than core region 6, as shown in FIG. 2. However, the pin count of the core limited design is generally less than that of the pad limited design. Therefore, the input/output area 4 is able to surround the core region 2 closely without extra wiring area, and the size of the chip is mainly determined by surface area occupied by the core region. If surface area in the core region can be reduced, area for the whole silicon chip can be reduced as well. This is why this type of chip is called a core limited design chip.

In FIG. 2, the silicon chip in the core region 6 generally has a lower gate count because the internal circuitry is simpler. Therefore, the core region 6 is relatively smaller. However, the number of pins it has is larger, and hence there is a wiring region 7 having very few actual wires and lots of blank space, which is a great waste of chip area. In general, this wiring region 7 is regarded as part of the core region, and the input/output slots 9 inside the input/output area 8 directly affect the chip area. Thus, if the width of each input/output slots 9 can somehow be reduced, for example, by producing a narrow and long input/output slot, the chip area can be reduced while more pins can be accommodated as well. This type of chip design is commonly known as a pad limited design chip.

FIG. 3 shows the shape of one of the input/output slots in the input/output area of FIG. 1. FIG. 4 shows the shape of one of the input/output slots in the input/output area of FIG. 2. As shown in FIG. 3, the input/output slot 3 is generally designed to have wide and fat dimensions so that chip area can be saved. The input/output slot 3 has a driver 10 and a bonding pad 11. Furthermore, the driver 10 and the bonding pad 11 can be configured into two types, namely A type and B type. That is, the bonding pad 11 can be within the driver 10, or the bonding pad 11 and the driver 10 can be separated from each other. The input/output slot design 9 as shown in FIG. 4 is normally used in a pad-limited design. It has a narrow and long profile so that chip area can be saved. Similarly, the input/output slot 9 has a driver 12 and a bonding pad 13, and has two types of combination, namely A type and B type.

FIG. 5 illustrates the design rules of input/output slots under the same group. Because input/output slots on all four sides may require interconnection, the design of input/output slots must facilitate interconnection. Therefore, input/output slots that need to be interconnected are grouped together and have similar design. As shown in FIG. 5, the input/output slots 14 and 15 both have the same height, but the width is different. Since the width of input/output slots 14 and 15 are different, each slot can accommodate different current ratings.

FIG. 6 is a diagram showing conventional layout of input/output slots around the silicon chip. As shown in FIG. 6, the input/output slots along side 16 need to accommodate a large current, and therefore requires larger drivers. Hence, the width of the input/output slots is larger. On the other hand, the input/output slots along side 18 need to accommodate only a small current, and therefore require smaller drivers. Hence, the width of the input/output slots is smaller. In FIG. 6, interconnecting devices between input/output slots 18 are not shown because no input/output slots are present for the interconnecting device to act. Due to the difference in current flowing from the input/output slots on each side of the chip, chip size is affected by the width of I/O slots on a particular side. Hence, the remaining sides of the silicon chip are under-utilized and optimal use of the chip area will be difficult to realize.

In light of the foregoing, there is a need to provide a method for better utilizing the chip area.

SUMMARY OF THE INVENTION

Accordingly, the present invention is to fabricate input/output slots having different heights so that the input/output area of a silicon chip can be reduced and chip area can be fully utilized.

To achieve these and other advantages and in accordance with the purpose of the invention, as embodied and broadly described herein, the invention provides a silicon chip having a mixed input/output slot structure. The silicon chip comprises a plurality of input/output slots having different height levels so that the input/output slots on the same side use input/output slots having the same height. Height level on different sides of the input/output slot area can be different depending on design criteria. Furthermore, corner cells can be fitted onto the four corner sections of the chip so that the input/output slot in different groups (having different height levels) can be joined together. Consequently, the problem of matching input/output slots having different height levels and different power rings is solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 is a sketch of a silicon chip having a core limited design;

FIG. 2 is a sketch of a silicon chip having a pad limited design;

FIG. 3 shows the shape of one of the input/output slots in the input/output area of FIG. 1;

FIG. 4 shows the shape of one of the input/output slots in the input/output area of FIG. 2;

FIG. 5 illustrates the design rules of input/output slots in the same group;

DESCRIPTION OF THE PREFERRED EMBODIMENTS

Figure 6:
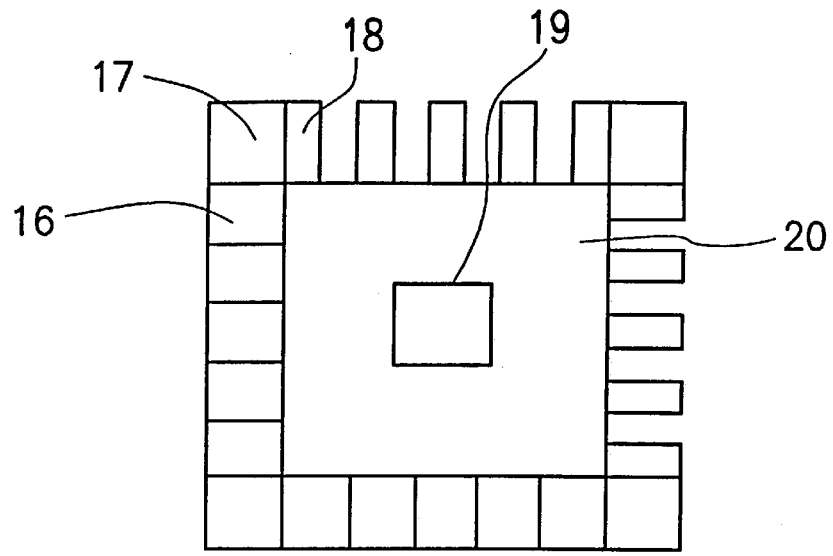
FIG. 6 is a diagram showing conventional layout of input/output slots around a silicon chip.

Reference will now be made in detail to the present preferred embodiments of the invention, examples of which are illustrated in the accompanying drawings. Wherever possible, the same reference numbers are used in the drawings and the description to refer to the same or like parts.

Figure 7:
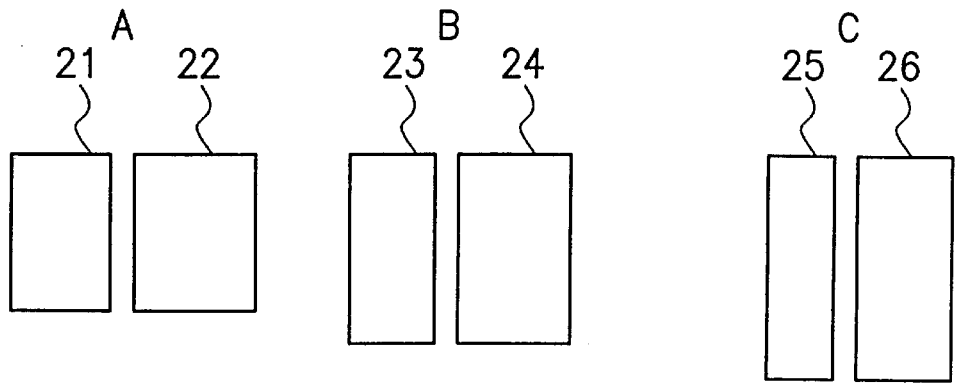
FIG. 7 shows the shapes of input/output slots in various groups.
Figure 8:
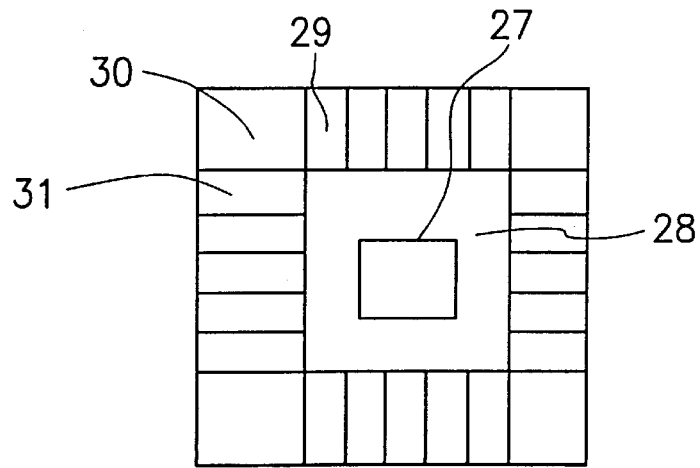
FIG. 8 is a diagram showing the layout of mixed input/output slot structure around a silicon chip according to this invention.

FIG. 7 shows the shapes of input/output slots in various groups, and FIG. 8 is a diagram showing the layout of a mixed input/output slot structure around a silicon chip according to this invention.

First, as shown in FIG. 7, input/output slots in the same group have the same height. For example, both input/output slots 21 and 22 in group A have a first height. Similarly, both input/output slots 22 and 23 in group B have a second height, while both input/output slots 24 and 25 in group C have a third height. However, input/output slots within the same group can have unequal width. For example, the width of input/output slot 22 in group A that allows a maximum current of 24 mA (having more circuit connections) to flow through is wider than the input/output slot 23 that only allows a current flow of 12 mA to flow through. Yet, for the same permissible current of 24 mA to flow through, the width of input/output slots in different groups may not be the same due to a difference in height between groups. For example, an input/output slot (I/O slot 26 in group C) that allows the flow of a 24 mA current may be narrower than an input/output slot (I/O slot 21 in group A) that allows the flow of a 12 mA current. In general, a wider I/O slot within the same group is capable of having more complicated circuits.

Next, as shown in FIG. 8, input/output slots 29 and 31 of 2 different groups are used on two different sides of the peripheral area surrounding the central core region 27 and the wiring region 28. I/O slots 29 used on one side has a different height from the I/O slots 31 used on the adjacent side because they belong to a different group. However, a corner cell 30 can be used to connect adjacent input/output slots where each has a different height level. Therefore, by optimizing the input/output slots surrounding a silicon chip, extra wiring region 28 can be eliminated and the chip surface area can be reduced.

Figure 9:
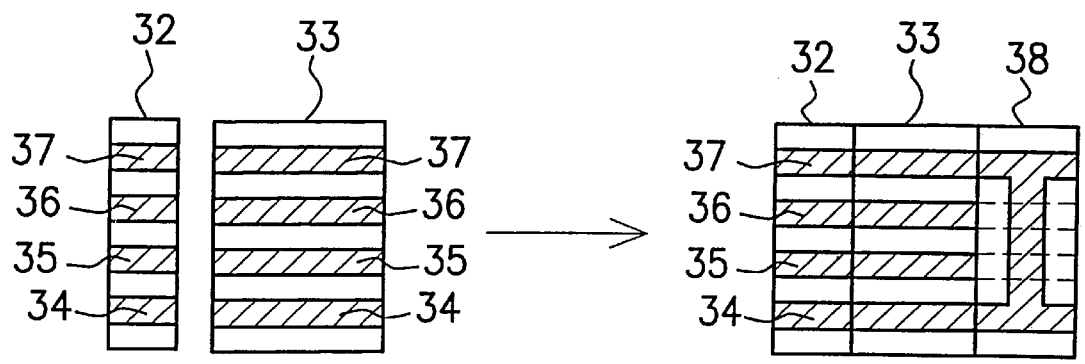
FIG. 9 shows the power ring structure within two input/output slots having different widths both belonging to the same group.

FIG. 9 shows the power ring structure within two input/output slots 32 and 33, where each has a different width but both belong to the same group. Since the I/O slots in the same group have the same height, power rings of I/O slots 32 and 33 are at the same levels. However, a wider I/O slot such as 33 can accommodate circuits that are more complicated. For example, I/O slots 32 and 33 contain a first power ring layer 34, a second power ring layer 35, a third power ring layer 36 and a fourth power ring layer 37. When two input/output slots such as 32 and 33 are put together as shown in the right side of FIG. 9, power rings within the same level can be joined together. When all the power rings are linked together, a circular power ring is formed. In addition, if the fourth power ring 37 and the first power ring 34 of I/O slot 38 are connected together as shown in FIG. 9, the connection has to pass through several layers. Therefore, the connection has to be isolated in order to maintain the proper power ring sequence and to prevent the formation of a power ring cross that may lead to short-circuiting.

Figure 10:
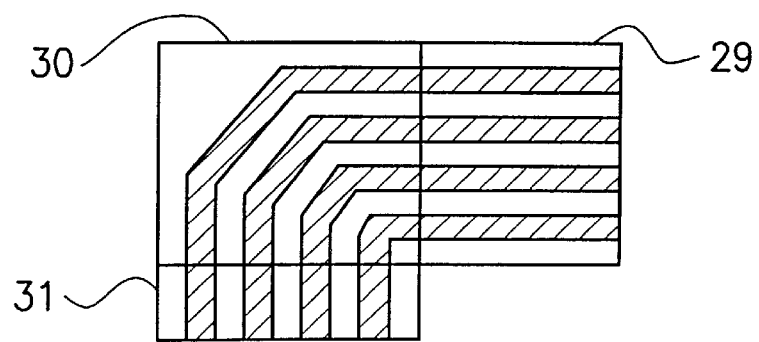
FIG. 10 is a magnified view showing a corner cell and its connection with the input/output slots on adjacent sides of the chip.

FIG. 10 is a magnified view of the corner cell 30 and its connections with the input/output slots 29 and 31 on adjacent sides of the chip. As mentioned before, since neighboring I/O slots have the same height, their power rings can be joined together. However, different sides have different heights, so a corner cell is used to join together I/O slots that have different heights. As shown in FIG. 10, although input/output slots 29 and 31 have different heights, the two are joined together through the corner cell 30. Consequently, a choice of sides for placing the input/output slots can be made instead of having to adhere to a particular side. Hence, an optimized chip area is easier to obtain.

In this embodiment, a silicon chip having a pad limited design is used as an illustration. However, this invention can also be applied to a silicon chip having a core limited design. In this case, the only difference is that there is no wiring region.

As a summary, this invention uses two or more types of input/output slots, each type having a different height. Therefore, the layout of input/output slots around the silicon chip will not be affected by the restriction on one side, hence chip size can be reduced and chip surface can be fully utilized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon chip having a mixed input/output slot structure comprising:

a core region having a plurality of circuits formed thereon;

a wiring region surrounding and linked to the core region; and an input/output area surrounding and linked to the wiring region and having a plurality of input/output slots and four corner cells, wherein the input/output slots are divided into groups with each group having a different height, and input/output slots on the same side of the input/output area all have the same height, and each of the corner cells physically connects to the adjacent input/output slots to match the different height of each input/output slot group.

2. The structure of claim 1, wherein each input/output slot includes a bonding pad and a driver.

3. The structure of claim 1, wherein the input/output slots on one side of the input/output area all have the same height and all belong to the same group.

4. The structure of claim 3, wherein the input/output slots that belong to the same group have the same height but not the same width.

5. The structure of claim 1, wherein each input/output slot has a plurality of power rings.

6. The structure of claim 5, wherein the input/output slots on one side of the input/output area have the same height so that adjacent power rings in respective layers are joined together.

7. The structure of claim 1, wherein the corner cells are located on four corners of the silicon chip and each corner cell is capable of connecting up input/output slots that belong to different groups.

8. A silicon chip having a mixed input/output slot structure comprising:
   a core region having a plurality of circuits formed thereon; and
   an input/output area surrounding and linked to the core region and having a plurality of input/output slots and four corner cells; wherein the input/output slots are divided into groups with each group having a different height, and input/output slots on the same side of the input/output area all have the same height, and each of the corner cells physically connects to the adjacent input/output slots to match the different height of each input/output slot group.

9. The structure of claim 8, wherein each input/output slot includes a bonding pad and a driver.

10. The structure of claim 8, wherein the input/output slots on one side of the input/output area all have the same level of height and all belong to the same group.

11. The structure of claim 10, wherein the input/output slots that belong to the same group have the same height but not the same width.

12. The structure of claim 8, wherein each input/output slot has a plurality of power rings.

13. The structure of claim 12, wherein the input/output slots on one side of the input/output area have the same height so that adjacent power rings in respective layers are joined together.

14. The structure of claim 8, wherein the corner cells are located on four corners of the silicon chip and each corner cell is capable of connecting up input/output slots that belong to different groups.

* * * * *